United States Patent [19]

Imura

[11] 4,246,646
[45] Jan. 20, 1981

[54] MAGNETIC BUBBLE CHIP-MOUNTING PLANE

[75] Inventor: Ryo Imura, Kokubunji, Japan
[73] Assignee: Hitachi, Ltd., Japan
[21] Appl. No.: 54,797
[22] Filed: Jul. 5, 1979

[30] Foreign Application Priority Data

Jul. 7, 1978 [JP] Japan .............................. 53-92842[U]

[51] Int. Cl.³ .......................... G11C 5/04; G11C 19/08
[52] U.S. Cl. ....................................................... 365/2
[58] Field of Search .......................................... 365/2

[56] References Cited

U.S. PATENT DOCUMENTS

| | | | |
|---|---|---|---|
| 4,068,219 | 1/1978 | Chow | 365/2 |
| 4,101,970 | 7/1978 | Saito et al. | 365/2 |

OTHER PUBLICATIONS

IBM Technical Disclosure Bulletin, vol. 20, No. 1, Jun. 1977, pp. 365-366.

Primary Examiner—James W. Moffitt
Attorney, Agent, or Firm—Craig & Antonelli

[57] ABSTRACT

In a mounting plane for placing a plurality of magnetic bubble chips in coils for generating a rotating magnetic field which consist of an inner coil and an outer coil, a magnetic bubble chip-mounting plane characterized by being made of an electrically conductive plane whose electric resistivity is $10^{-3}$ to $10^{+4}$ $\Omega$·cm and by being provided with a cut-away part in that region of the plane which is surrounded by only the inner coil.

4 Claims, 5 Drawing Figures

FIG. 1
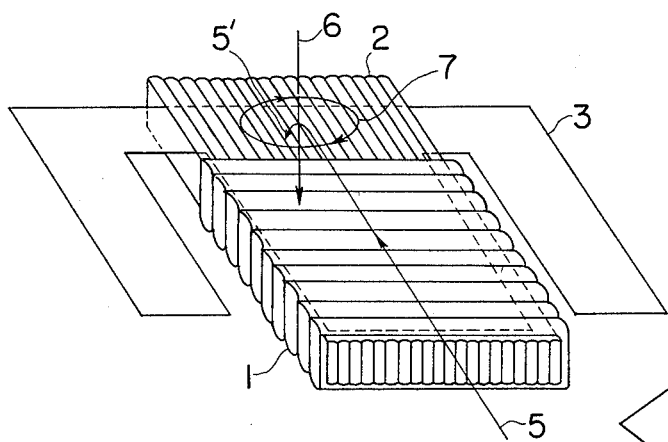
FIG. 2
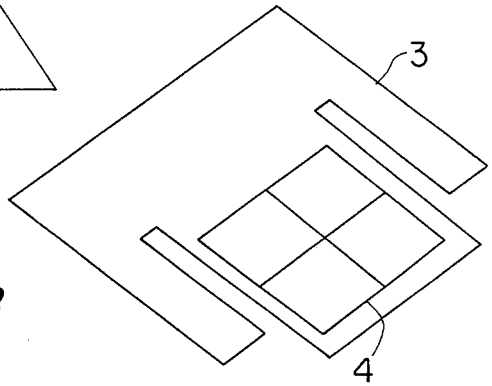
FIG. 3A
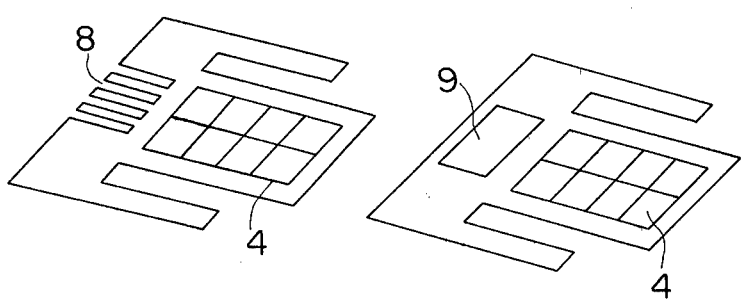
FIG. 3B
FIG. 4
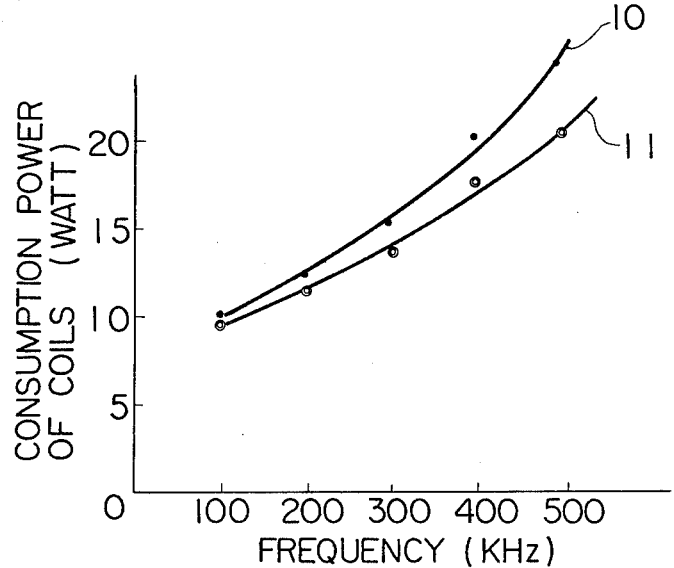

MAGNETIC BUBBLE CHIP-MOUNTING PLANE

BACKGROUND OF THE INVENTION

1. Field of the Invention

This invention relates to a mounting plane for installing a plurality of magnetic bubble chips in rotating magnetic field-generating coils.

2. Description of the Prior Art

Two examples of magnetic bubble chip-mounting planes presently in use are; (i) an insulating plane made of ceramics or the like and (ii) a conductive plane made of a flexible material and having a high electric resistivity. Although the insulating plane does not undergo any high-frequency loss, such as eddy current loss attributable to a high-frequency current flowing through a coil for generating a rotating magnetic field, it has no electrostatic shielding effect. Conversely, although the conductive plane has an electrostatic shielding effect, it cannot avoid high-frequency losses due to eddy current. Thus, both the insulating and the conductive mounting planes have advantages and disadvantages and improvements have been sought in this area.

SUMMARY OF THE INVENTION

It is accordingly an object of this invention to provide a magnetic bubble chip-mounting plane which has an electrostatic shielding effect and in which high-frequency losses due to eddy current are minimized.

In order to accomplish this objective, according to this invention, a conductive plane exhibiting a high electric resistivity is used as a magnetic bubble chip-mounting plane, and a cut-away part is formed in that region of the mounting plane which is surrounded by only an inner coil of coils for generating a rotating magnetic field.

With this plane for mounting magnetic bubble chips, the following effects are accomplished; (i) while maintaining the electrostatic shielding effect, the eddy current loss can be minimized and (ii) heat generation due to the eddy current loss of the mounting plane is suppressed, resulting in a reduced temperature rise of the magnetic bubble chips.

BRIEF DESCRIPTION OF THE DRAWINGS

FIG. 1 is a perspective view showing the eddy current loss,

FIG. 2 is a schematic perspective view showing a magnetic bubble chip-mounting plane of the prior art, FIGS. 3A and 3B are schematic perspective views each showing a magnetic bubble chip-mounting plane according to this invention, and FIG. 4 is a graph for explaining an effect of this invention.

DESCRIPTION OF THE PREFERRED EMBODIMENTS

FIG. 1 is a view which elucidating the eddy current loss. Referring to the figure, a mounting plane 3 is received in rotating magnetic field-generating coils which consist of an outer coil 1 and an inner coil 2. Although not shown, planes which are the same as the mounting plane 3 in shape and in material and on which no chip is placed are, in actuality, disposed in a manner to sandwich the mounting plane 3 therebetween, and they are respectively grounded and function as electrostatic shielding plates. Magnetic bubble chips 4 are placed on that area of the mounting plane 3 which is surrounded by both the outer coil 1 and the inner coil 2 (refer to FIG. 2). Since the mounting plane 3 has the magnetic bubble chips placed thereon as described above, it needs to have a certain amount of strength and an electrostatic shielding effect. It is desirable that the resistivity of the mounting plane lies in a range of $10^{-3}$–$10^{+4}\Omega\cdot cm$. This range is dictated by the fact that when the resistivity is lower than $10^{-4}\Omega\cdot cm$, the material falls in the region of metal, so that the eddy current freely flows thus making the mounting plane unusable. When the resistivity is higher than $10^{+4}\Omega\cdot cm$, the material falls in the semiconductor or insulator region, and no electrostatic shielding effect is attained. A compressed plane of carbon fibers is one of the materials fulfilling these conditions.

The mechanism of the generation of an eddy current will now be described. A magnetic line of force 5 of the outer coil 1 is curved in the direction of a bias magnetic field 6 or in the direction of upper and lower linear ferrite plates (not shown) at the open end part of the outer coil by means of a bias magnetic circuit. A magnetic line of force 5' of the outer coil 1 is curved in the direction of the bias magnetic field 6 which permeates through the mounting plane 3 perpendicularly. When the high-frequency magnetic field permeates through the conductive mounting plane 3 perpendicularly, an eddy current loop 7 appears, and an eddy current loss takes place. The loss turns into heat, which conducts in the mounting plane 3, resulting in incurring the temperature rise of the magnetic bubble chips 4. Likewise, an eddy current develops at the open end part of the inner coil 2. However, in the place where a magnetic line of force of the inner coil 2 is curved, the mounting plane 3 is non-existent or has a small area, so that the eddy current is negligible. The eddy current loss increases more as the eddy current loop 7 becomes greater. It is therefore understood that, in order to suppress such eddy current loss to the minimum, a "window" may be provided in the mounting plane part in which the eddy current develops (the plane region which is surrounded by only the inner coil 2), or "notches (pectinate form)" which cut the eddy current of great loop may be formed. That is, by cutting away a part of the mounting plane, the eddy current loop is divided, thus minimizing the loss. Of course, this must not interfere with its function as a mounting plane.

FIG. 3A shows an example of a magnetic bubble chip-mounting plane in which notches (pectination) 8 are formed in an eddy current-generating region. FIG. 3B shows an example of the mounting plane in which a window 9 is provided in the region. FIG. 4 illustrates the comparison of the effect of suppressing the eddy current loss between the case where a window of 1 cm×2 cm is provided in the mounting plane 3 (FIG. 3B) and the case where no window is formed (FIG. 2). In the graph of FIG. 4, the ordinate axis represents the power consumption of the coils for generating a rotating magnetic field (the total power consumption of both the inner and outer coils as measured in watt), while the abscissa axis represents the frequency of the rotating magnetic field (in KHz). The amplitude of the rotating magnetic field is 50 Oe. In the graph, a curve 10 corresponds to the case of using the prior-art mounting plane shown in FIG. 2, and a curve 11 the case of using the mounting plane according to this invention shown in FIG. 3B. As seen from the illustration, the eddy current-suppressing effect owing to the window becomes greater as the frequency of the rotating magnetic field becomes higher. Recently, it has been used to render the operating speed of a magnetic bubble memory high, and thus the rotating magnetic field-driving frequency has reached 300–500 KHz. The decrease of power consumption of the rotating magnetic field-generating coils in this frequency range becomes about 10–20%, which indicates that the present invention is very effective. When converted into the temperature change of the magnetic bubble chips, the aforecited depreciation becomes approximately 2°–4° C. That is, it is possible according to this invention to suppress the heat generation based on the eddy current loss of the mounting plane and to restrain the temperature rise of the magnetic bubble chips.

Although the case of the window has been described above for the explanation of the effects, substantially the same effects were achieved in cases of forming the notches (pectination) or by using a large number of small circles, etc.

As set forth above, this invention can provide a magnetic bubble chip-mounting plane which has an electrostatic shielding effect and which suppresses eddy current loss. The temperature rise of the mounting plane ascribable to the eddy current loss is accordingly suppressed, with the result that the temperature rise of the magnetic bubble chips can also be suppressed. Thus, the service temperature range of the magnetic bubble memory can be expanded, and the applications thereof can be widened. Therefore, the invention may be used advantageously in industry.

I claim:

1. In a mounting plane for placing a plurality of magnetic bubble chips in rotating magnetic field-generating coils which consist of an inner coil and an outer coil wherein said; a magnetic bubble chip-mounting plane comprises a conductive plane whose resistivity is $10^{-3}$ to $10^{+4} \Omega \cdot cm$ is provided with a cut-away part in that region of said plane which is surrounded by only said inner coil.

2. A magnetic bubble chip-mounting plane as defined in claim 1, wherein said conductive plane is a compressed plane of carbon fiber.

3. A magnetic bubble chip-mounting plane as defined in claim 1 or claim 2, wherein said cut-away part is in the shape of a window.

4. A magnetic bubble chip-mounting plane as defined in claim 1 or claim 2, wherein said cut-away part has a pectinate shape.

* * * * *